Sept. 23, 1969 YOSHIHIKO MIZUSHIMA ET AL 3,469,117

ELECTRIC CIRCUIT EMPLOYING SEMICONDUCTOR DEVICES

Filed Dec. 30, 1966 2 Sheets-Sheet 1

INVENTORS
Yoshihiko Mizushima
Yoshiharu Okamoto

BY
Watson, Cole, Grindle & Watson
ATTORNEYS

Sept. 23, 1969 YOSHIHIKO MIZUSHIMA ET AL 3,469,117

ELECTRIC CIRCUIT EMPLOYING SEMICONDUCTOR DEVICES

Filed Dec. 30, 1966 2 Sheets-Sheet 2

INVENTORS

Yoshihiko Mizushima

Yoshiharu Okamoto

BY Watson, Cole, Grindle & Watson

ATTORNEYS

United States Patent Office
3,469,117
Patented Sept. 23, 1969

3,469,117
ELECTRIC CIRCUIT EMPLOYING SEMICONDUCTOR DEVICES

Yoshihiko Mizushima and Yoshiharu Okamoto, Tokyo, Japan, assignors to Nippon Telegraph and Telephone Public Corporation, Tokyo, Japan Filed Dec. 30, 1966, Ser. No. 606,236
Claims priority, application Japan, Jan. 8, 1966, 41/697
Int. Cl. H03k 3/26
U.S. Cl. 307—302 5 Claims

ABSTRACT OF THE DISCLOSURE

A transistor circuit for pulse or oscillatory signal generation utilizes a junction transistor having a four semiconductor layer structure with an intrinsic semiconductor layer between the collector and base electrodes. An emitter impedance of between 10 and 100 ohms is inserted in the emitter circuit and a collector voltage sufficient to make a DC base current flow in a reverse direction to that in the lower collector region but lower than either the avalanche or the punch-through voltages of the transistor is provided. The emitter is injected with sufficient current to induce the avalanche breakdown of the transistor. Either the emitter or the collector may be modulated with an input signal. A significant improvement is produced in the pulse rise and fall times, the operation frequency, and the oscillation frequency is made independent of the external circuit impedances.

This invention relates to a circuit utilizing semiconductor devices which generates high-speed pulses and makes a switching operation at an ultra-high repetition rate by utilizing a negative resistance.

The use of a negative resistance in high-speed pulse generating circuits is known. But new pulse generating circuits or circuit-elements having high-speed pulses, narrow waveform and high output are increasingly desired today. The nature of various known conventional devices and circuits employing them shall be described here along with a description of the invention.

Generally, there are known such various conventional pulse-generating circuits employing semiconductor devices as multivibrators and blocking oscillators. However, their circuit arrangements are so complicated and their repetition frequencies and their pulse rise-fall-times are not completely satisfactory that there is a need for improvement.

Tunnel diodes are well known as semiconductor devices which can generate high-speed pulses. But they have a defect in that their output is low. Further, there are double base diodes, pnpn switches, cryosars and various other pulse-generating devices utilizing negative resistances. However, they still can not generate completely satisfactory high-speed pulses. Therefore, devices of much higher speed are required.

Further, so-called avalanche-transistors based on positive feedback effects by an insertion of base resistances utilizing avalanche effects, and so-called punch-through-avalanche-multiplication transistors based on relaxation oscillations utilizing the discharge between the emitter and collector by applying punch-through effects are known as devices by which comparatively high repetition frequencies can be obtained. However, their repetition frequencies are usually only about 100 to 200 megacycles. In these devices, the time constant of the external circuit limits the repetition frequency. However, even when a small time constant is selected the magnitude of the pulse output will have an influence on the repetition frequency and an upper limit in the frequency will exist. The frequency will still remain in the range of about 100 to 200 megacycles.

Now, devices for high-speed switches shall be considered. Such conventional devices utilizing semiconductor negative-resistance as, for example, pnpn four-layer diodes, double-base diodes and cryosars are not satisfactory with regards to the high-speed switching operation which present technology demands. The avalanche-injection diodes which are of comparatively high-speed will not operate in the low voltage range. Tunnel diodes are of comparatively high-speed and operate even at low voltages, however, the impedance is so low that there is a difficulty in using them in circuit arrangements. There is a need for current-controlled negative resistance devices which, in a low voltage range, can be combined with such tunnel diodes.

In view of these facts, the primary object of the present invention is to provide an electric circuit employing semiconductor devices which generates narrow pulses of high repetition frequency, performs amplifying-and regenerating-operations and makes a switching operation at an ultra-high-speed by the utilization of negative resistances.

In the accompanying drawings.

First of all, the operation of the circuit of the present invention shall be briefly described.

In the circuit of the present invention for generating pulses, the method utilizing an avalanche phenomenon in semiconductors is quite different from conventional semi-conductor devices wherein, when the applied voltage exceeds the avalanche breakdown voltage, discharge will start and will show a relaxation determined by the external time constant. In the present invention, the applied voltage is so set as not to exceed the breakdown voltage or punch-through voltage, and pulses will be able to be generated at a very high-speed and relaxation will exist in the semiconductors independently of the external time constant so that the pulse frequency may be continuously varied.

Further, the circuit of the present invention for a high-speed switch is not based on such simple principle as that of a negative resistance in a transistor utilizing commonly known avalanche multiplication. This point will become clear in the later description. I short, in the present invention, a current-controlled high-speed negative resistance will be shown which is not influenced by the external time constant in the same way as in the case of pulse generation.

Figure 1:
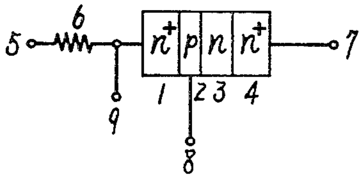
FIG. 1 is a schematic arrangement diagram of circuit devices embodying the present invention.

FIG. 1 is a schematic arrangement diagram of a circuit embodying the present invention. Elements 1, 2, 3 and 4 are semiconductor layers which can be considered to be electrodes corresponding respectively to the emitter, base, space charge layer and collector of an ordinary transistor, but it should be noted that they function differently. Their operating principles are explained as follows: 5 is a carrier injection-voltage feeding terminal; 6 is a resistance, for example, such as a current limiting impedance; 7 serves both as a bias-voltage-feeding terminal for the semiconductor layer between 3 and 4 and the output terminal at a collector of the generated pulses or an output of the switching operation at an ultra-high repetition rate; 8 is a voltage-feeding terminal for the semiconductor 2; 9 is both a terminal for taking out the potential of the semiconductor layer 1 and an output terminal for emitter 1.

Here the sign $n^+$, $p$, $n$ and $n^+$ showing the conduction types of the semiconductor layers 1, 2, 3 and 4 represent, respectively, a layer containing a comparatively large amount of impurities, a thin layer low in impurity density (formed much thinner than any other layer), a low impurity density layer (which may be considered to be lower in impurity density than the semiconductor 2) and a high impurity density layer (which may be considered to be higher in impurity density than the semiconductor layer 1). Further, the semiconductor layer 3 can be replaced, for example, with a layer $i$ of an intrinsic semiconductive layer of an impurity density lower than the density represented by $n$.

As the semiconductor layer 3, or a highly resistive layer, is required to produce an avalanche effect, the voltage (i.e. a reverse bias) is applied between the semiconductor layers 4 and 2 so that the part of the semiconductor layer 3 is a carrier depletion layer, i.e. a space-charge layer. Therefore electrodes to be substantially considered may be the first, second and third electrodes of the semiconductor layers 1, 2 and 4, respectively.

In the present invention, a voltage is applied between the semiconductor layers 3 and 4 so that the semiconductor layer 3 becomes specifically a carrier depletion layer. If such high voltage is applied that the semiconductor layer 2 will become a carrier depletion layer the device will be therefore in a punch-through state from the semiconductor layer 1 to 4. Therefore, in the present invention, a voltage below the punch-through voltage is applied to the semiconductor layer 4.

Further, in another case, if the voltage applied to the semiconductor layer 4 is further elevated, an avalanche breakdown will occur between the semiconductor layers 4 and 2, therefore the current will quickly increase and a permanent degradation will occur between the semiconductor layers 4 and 2. Therefore, in the present invention, it is also necessary to make the positive potential applied to the semiconductor layer 4 lower than the avalanche breakdown voltage.

Therefore, the upper limit of the potential of the semiconductor layer 4 must be selected lower than either the punch-through voltage or the avalanche breakdown voltage.

The lower limit of the potential of the semiconductor layer 4 is the voltage wherein, the case electrons are injected into the semiconductor layer 1, a positive charge will flow out of the semiconductor layer 2. Below that voltage, the charge will flow in. This voltage range is the operating range of an ordinary transistor. That is to say, when the potential of the semiconductor layer 4 is increased from zero, the current through the semiconductor layer 2 will flow as a positive current into said semiconductor layer from outside, but there will be a point at which the direction of current flow will finally change its direction. It shows that an avalanche multiplication has begun.

The point at which the condition described above is reached is defined as the above mentioned lower limit. When the potential of the semiconductor layer 4 is further increased until it reaches the avalanche breakdown voltage, i.e. the turn over voltage which value is defined in the case of no injection from the emitter, or the punch-through voltage whichever is lower, such point will be determined as an upper limit.

Therefore, the current direction of the semiconductor layer 2 can be represented by the voltage applied between the semiconductor layers 4 and 2.

The features of the applied voltage to the circuit of the present invention have been described above. Now, the essential process of pulse generation shall be briefly explained.

Figure 2:
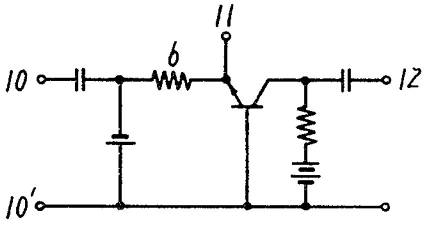
FIGURE 2 is a schematic of a circuit for generating pulses using an npn transistor.

FIG. 2 is a fundamental diagram of a circuit in which a base electrode is made a common terminal for generating pulses by utilizing a device of the npn transistor type. Needless to say, the npn type and the compatible pnp type are conjugate to each other in polarity and the same principle can be also applied to the latter as to the former. Here 10 is a emitter injection voltage terminal or pulse input terminal, 10' is a common terminal, 11 is a pulse output terminal of positive polarity, 12 is a pulse output terminal of negative polarity.

Figure 3:
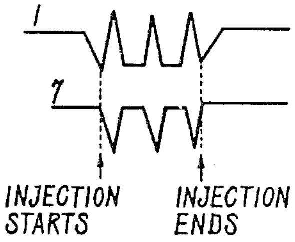
FIGURE 3 illustrates the pulse waveform output of the circuit shown in FIGURE 2.

When an injection voltage is applied to the terminal 5 of the device of the transistor arrangement shown in FIG. 1, electrons will be injected from the semiconductor layer 1 into the semiconductor layers 2 and 3; positive current pulses will appear at the terminals 9 and 8; negative voltage pulses will appear at the terminal 7. The waveform of the pulses will be as in the diagram in FIG. 3. As described later, due to the injected electrons, a transient avalanche breakdown will be induced within the semiconductor. However, the condition of the current continuity at the base region will not be satisfied between the injected electrons and, the holes which are generated by the avalanche multiplication and flowing toward the semiconductor layer 1. Therefore the multiplication by the avalanche effect will stop. As this process repeats within the semiconductor, the pulse train will reappear.

Therefore, such pulse train will appear only while the injection is being carried out. Its amplitude will be determined by the magnitude of the applied voltage (reverse bias voltage) to the semiconductor layer 4. Further, the repetition frequency of the pulses is determined by the magnitude of the injected current.

In such case, as found from the above description, if the injection voltage has as short a duration as that of the pulses, each pulse appears in an exact correspondence to the input pulse. Further, it will be understood from the later described explanation that the output pulses have a larger amplitude and narrower waveform than of the input pulse (injection voltage).

It will be also clear from the above description that, if the injection voltage varies with time, the repetition frequency of the output pulses will also vary in response to it. Further, even in such a case where the reverse bias voltage applied to the semiconductor layer 4 varies with time, the amplitude of the output pulses will vary in response to it.

The function of the high-speed pulse generation in the circuit of the present invention shall be further explained in detail so that its operation may be better understood.

The internal field of the avalanche multiplication layer corresponding to the semiconductor layer 3 (the above described depletion layer) is not only related to the impurity density within it but also varies with the density of the current passing through said depletion layer. Therefore, when a field caused by a space charge due to the injected current together with an already applied field reaches the breakdown field strength of the semiconductor medium, a breakdown will occur.

Therefore, the present invention is based on the theoretical discovery and experimental verification of this phenomeon. The first feature of the operating principle is that the injected current density is so controlled as to exceed a critical limit under such applied bias voltage as not to reach the avalanche breakdown voltage but in the region of an avalanche multiplication in the avalanche multiplication space. If the density of the carrier injected from the semiconductor layer 1 into the above described space exceeds a certain limit, the potential distribution in this space will vary, and therefore the characteristic avalanche breakdown voltage correspondingly decrease. The breakdown will be induced by the injection. Needless to say, the carrier injected into said multiplication space need not be through the pn junction. The carrier may be introduced into the semiconductor, for example, by being irradiated with light.

In such state, a discharge is caused between the semiconductor layers 2 and 4, and the charge stored in the semiconductor layer 4 including a stray capacity, will flow as a discharge current.

Such discharge current will arise due to the ionization of the crystal lattice of the semiconductor layer 3 (avalanche-multiplication space). Therefore, the electrons and holes will flow respectively in reverse directions; the electrons will immediately flow into the positive semiconductor layer 4, but the holes will flow toward the negative semiconductor layer 2.

The avalanche breakdown as induced by the field made by the injected electrons, in this case, must maintain itself. However, the boundary condition at the semiconductor layer 4 for sustaining the breakdown is different from those of the opposite boundaries (the boundaries of the semiconductor layer 3). That is to say, in order that the increased current in the discharging state is to be sustained, a larger electron current than for the previous injection must be fed from the semiconductor layer 2 to the semiconductor layer 3. Therefore, in the circuit device of the present invention the resistance 6 causes a voltage drop and limits the amount of injection; the boundary conditions at both boundary surfaces will not be generally satisfied simultaneously.

Especially, the holes which have arrived at the semiconductor layer 2 will greatly elevate the hole density and therefore the injection efficiency from the semiconductor layer 1 will be reduced. The injected electron current will decrease and will make the sustaining of the above mentioned conditions impossible. Therefore, the discharge will vanish within a very short time and the voltage of the layer 4 will rise to the original value. Thus, as long as the injection lasts, the discharge repeats again and the train of pulses will be generated. This process is the second feature of the present invention.

In this case, the pulse current will flow through the respective semiconductor layers and the voltage pulse will be generated in the positive direction at the semiconductor layers 1 and 2 and in the negative direction at the semiconductor layer 4. The pulse rise-time will be determined by the avalanche-ionization-rate constant and the saturation drift-velocity and is in fact about $10^{-12}$ seconds. But, in fact, it is somewhat lowered due to a lead inductance. The discharging time will be determined by the saturation drift velocity and is presumed to be ususally about $10^{-11}$ seconds.

When the avalanche vanishes and the original state is to be restored, the generated carrier will have to move toward a static potential configuration or a state of minimum free energy. Therefore, what defines this time interval is a characteristic "relaxation time" determined by the conductivity of the semiconductor space 3. When there is an injected carrier, the conductivity will be also influenced. The greater the injected carrier, the shorter the characteristic relaxation time in the equilibrium state. Therefore, when the amount of the injected carrier is increased, the recovery time will be reduced and therefore the repetition frequency of pulses will increase. It is the third feature of the present invention that the repetition frequency can be thus defined by the injected current.

The magnitude of the generated pulses will be proportional to the charge generated by the voltage applied to the layer 4 at the beginning of the discharge. Therefore, the magnitude of the pulses can be increased by increasing this applied voltage.

In the above pulse generation, its repetition, rise-and fall-times will not be defined by any external time constant. This is in contradistinction from the pulse generation by ordinary transistors or that utilizing punch-through effects, which shows a relaxation oscillation determined by the external time constant. This is perhaps most advantageous feature of the present invention.

Further, in the present invention, the resistance 6 connected in series with the semiconductor layer 1 defines the condition of the pulse generation but has no relation with the speed and repetition frequency. Further, the resistance connected in series with the semiconductor layers 2 and 4 has no relation with the condition, speed and repetition frequency of the pulse generation. This is because of the intrinsic negative resistance of the avalanche itself induced by the injected carrier. It is the substantial reason why the high-speed can be reached.

In the present invention, as shown in FIG. 1, an embodiment of parallel arrangement of the semiconductor layers is presented. It is also possible to cause an avalanche at a low voltage by making the field concentrate at the semiconductor layer 4; it is due to a spreading-resistance effect by making the area of the semiconductor layer 4 specifically small. Thereby, the practical effect will be large. The present invention includes the electrode configuration by any known conventional means so that the field is concentrated specifically on the front surface of the semiconductor layer 4.

A method of forming the structures in FIG. 1 shall be explained here. In the below described explanation, the respective layer structures shall be explained with the names of an emitter, base and collector as in the case of a transistor.

First of all, an *n*-type layer of a thickness of 7 microns and of a donor impurity concentration of $2\times10^{15}$ cm.$^{-3}$ is attached to a single crystal (111) surface of silicon of a specific resistivity of $10^{-2}$ ohm centimeters (*n*-type) by an epitaxial vapor growth. A *p*-type layer of a thickness of 2 microns is made by a selective diffusion technique by making a window of an oxidized Si film thereon and a collector junction is made in a position of a depth of 2 microns by selecting the accepter impurity concentration on the surface to be $5\times10^{18}$. In the same manner, the emitter junction is diffused so as to be in a position of a depth of 1 micron in the next step. The technique of making them is usually known and need not be described in detail. It is not necessary to mention that pulses can be simultaneously handled as in the adding logic circuit by providing a plurality of emitter junctions. Thereafter, lead wires are attached by an ordinary method and the assembly is mounted on a case. This is adapted to a high frequency operation also as a transistor. The cut-off frequency $f_T$ is 700 megacycles.

The collector breakdown voltage in the ordinary sense of this transistor is 70 volts on the average. The punch-through voltage is about 60 volts.

Therefore, the collector voltage range required for the above mentioned pulse generation was below 70 volts and the voltage at which an avalanche multiplication was likely to occur was above 40 volts. In this voltage range, the base current will flow in the direction reverse to that in the case of an ordinary transistor operation and will show the occurrence of an avalanche. In this case, pulses were generated and the output amplitude increased with the collector voltage. When it exceeded the punch-through voltage, the pulse did not occur. Therefore, it could not be used above the punch-through voltage.

In the following explanation, the base electrode of the semiconductor device is considered to be grounded as a common terminal in the circuit arrangement. Therefore, the respective semiconductor potentials are represented in reference to the base potential.

Figure 4:
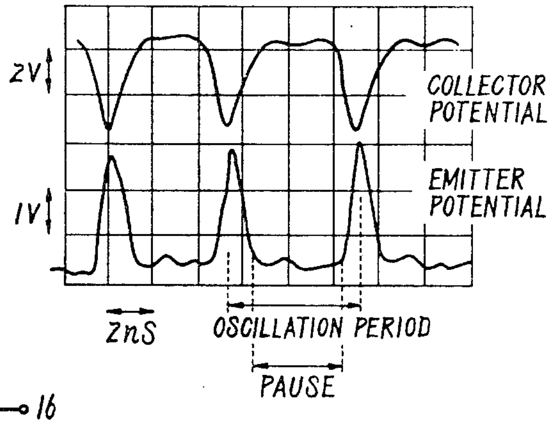
FIGURE 4 illustrates a repetitive pulse output waveform obtained from a circuit in accordance with the invention.

FIG. 4 shows an experimental example of the repetition waveforms of pulses obtained by the circuit arrangement of the present invention. Therein, an emitter potential and collector potential may be observed with a sampling oscilloscope. It is seen that a delay exists clearly between the pulses and that therefore the repetition is not limited by relaxation-like phenomenon defined by the apparent time constant of the external circuit. At this ime, the time constant determined by the product of the emitter resistance and capacitance is about 0.2 ns. It has been confirmed by experiments that such time constant is sufficiently shorter than the pulse frequency and that they are independent of each other.

Figure 5:
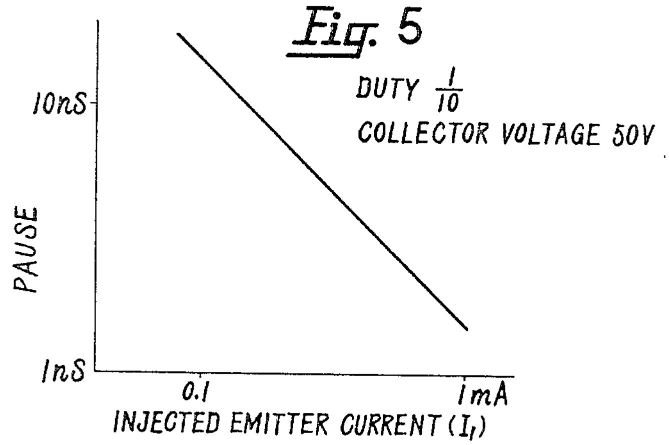
FIGURE 5 shows a plot of delay time vs. emitter ejection current.

An illustration of this length of delay-time against the emitter injections is in FIG. 5. It is found that evidently the delay has a characteristic relation to the amount of injection. In such cases, the other bias conditions are kept constant.

As the pause delay can be reduced, in an experimental example, a pulse oscillation of 300 megacycles was obtained in a continuously oscillating state by a direct current voltage. In the case of a low duty cycle by adding gate pulses to the terminal 5, a pulse oscillation of 500 megacycles was obtained.

These maximum limits are figures limited by heat generation in the collector junction and can be further elevated by improving the heat-conduction of the collector junction.

For this structure the resistance 6 was in the range of 150 to 400 ohms. When the resistance was varied while keeping the injected current unchanged, the repetition frequency and waveform of the pulses did not vary much. When this resistance was short-circuited, no pulse was generated. In the ordinary transistor operation, the resistance for such injection limitation will be disadvantageous as it reduces the injected current; whereas in the case of the present invention, it is found to be necessary.

When a resistance of about 10 to 1000 ohms was set in series in a collector or base circuit, it was found to have substantially no effect on the pulse-generating operation. But the pulse speed was reduced. That is to say, the present invention is not limited by the external circuit time constant and does not utilize the feedback effect through such external circuit. However, when an external resistance is connected in series with the base circuit (that is, between the common grounding point and the base electrode), the pulse speed will be reduced under the operating principle of the conventional avalanche transistor utilizing an avalanche with a feedback. Therefore, in the present invention, such impedance as to cause a positive feedback in the base circuit (in the case of common-base grounding) is not preferably connected in series with the base. In the case of varying the repetition period by the injection from the emitter, the output amplitude will not substantially vary and, in the case of varying the output amplitude by varying the reverse bias of the collector, the repetition period will not substantially vary. This feature is advantageous to the pulse circuit technique. In the case of conventional relaxation-oscillation determined by the external circuit time-constant, they will be always related to each other. However, in the case of the present invention, a nonequilibrium transient phenomenon will continuously occur within the semiconductor at such high-speed that the characteristics according to the present invention will have nothing to do with the external circuit time-constant and will be determined only by the boundary conditions within the transistor.

The delay of the pulse generation by triggering was investigated to be below 0.5 ns. This is the time required for the injected carrier to charge the emitter capacitance, to run through the base layer and depletion layer and to reach the collector, but is so small as to have no effect in practice.

Here, the confirmed results of the effects by experiments made by the present inventor shall be enumerated not only with respect to continuous pulse generating circuit devices but also with respect to other applications useful to the pulse circuit technique.

In the circuit in FIG. 2, when an input pulse of a width of 2 ns. and a magnitude of 0.5 volt was applied to the emitter, a narrow output pulse of a width of 0.5 ns. and a magnitude of 2 volts was obtained with a positive polarity; the amplification and shaping of the pulses were simultaneously carried out. Even when the input pulses were random with respect to time, an output corresponding to the input in 1:1 relation was obtained. A larger voltage was obtained on the collector side and was of a negative polarity.

Figure 6:
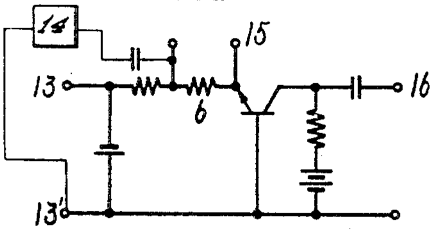
FIGURE 6 illustrates circuitry for the generation of a pulse train using an amplitude modulated wave for the emitter injection voltage.

As exemplified in FIG. 6, when the emitter injection voltage was an amplitude-modulated wave, a density-modulated pulse train was obtained in the collector and base. In FIG. 6, 13 is an input terminal for the emitter injection voltage or pulse amplification, 13' is a common terminal, 14 is a modulated voltage input terminal, 15 is a positive polarity pulse output terminal and 16 is a negative polarity pulse output terminal.

Figure 7:
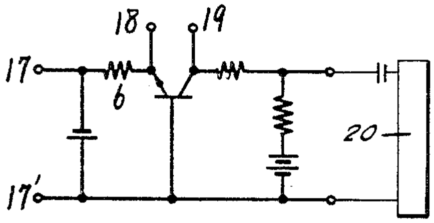
FIGURE 7 illustrates circuitry for generating an amplitude modulated pulse train using an amplitude modulated collector input voltage.

As exemplified in FIG. 7, when the collector voltage was an amplitude-modulated wave, also an amplitude-modulated pulse train was obtained in the emitter, base and collector. In FIG. 7, 17 is an input terminal for the emitter injection voltage or pulse amplification, 17', is a common terminal, 18 is a positive polarity pulse output terminal, 19 is a negative polarity pulse output terminal and 20 is a modulation voltage input terminal.

These pulses are so narrow as to be of a half-width of about 0.5 ns. and are not of a relaxation oscillation type in both rise-and fall-time. Excellent pulses as have never been possible to obtain with conventional transistors can be generated.

As understood from the above explanation, in the circuit devices of the present invention, the terminal through which the pulse output is to be taken is not always necessary to be on the collector side, that is, on the side of the semiconductor layer 4 but may also be on the emitter side, (on the side of the semiconductor layer 1) or on the base side (on the side of the semiconductor layer 2). The proper terminal can be selected by taking the polarity, amplification factor or the output impedance into consideration. In this respect, the present invention is quite different from the transistor which defines the input and output terminals or the punch-through transistor which is considered to be substantially of two terminals.

In the above explanation, the grounding connection of the circuit is of a grounded-base type. However, it need not be always of that type. For example, it has been confirmed by experiments that exactly the same result can be obtained even in the grounded collector type in the ordinary sense of the transistor words. It is naturally possible to combine such grounding with such modulating types as in FIGS. 6 and 7.

Figure 8:
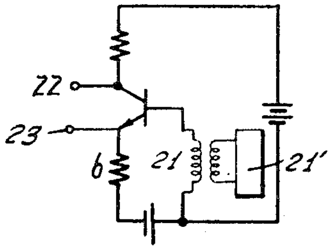
FIGURE 8 illustrates a base input type pulse generating circuit.

However, as an emitter series resistance is required, a type making the emitter as a common terminal can not be adopted. Therefore, the present invention excludes a circuit connection making the emitter directly a common terminal. Together with the fact that the base terminal preferably includes no resistance for a positive feedback, the negative resistance phenomenon seen in the circuit of the present invention has no resemblance with the so-called avalanche transistor. In this case, the common-connection type will be as in FIG. 8. In this circuit, the input impedance is high and the trigger efficiency is also high. In FIG. 8, 21 is a pulse terminal preferably connected to a pulse transformer inserted so as not to increase the base resistance, 21' is connected to a modulation voltage source, 22 and 23 are output voltage terminals. It is also possible to combine such base-input circuit type with such modulating systems as in FIGS. 6 and 7.

As explained above, the circuit according to the present invention is based on an entirely new operating principle. For example, pulse generation by utilizing the punch-through effect is related with an avalanche multiplication. But, the device by the punch-through effect is considered to be substantially a two-terminal one, whereas the device of the present invention is a three-terminal one and therefrom has a feature that it can easily be applied to pulse generation.

Further, as regards the thickness of the base layer 2, when the base layer 2 of a thickness exceeding 5 microns was tested, different from that of the above mentioned embodiment, the pulse operation did not occur. That is to say, it is necessary that the reaction of an avalanche breakdown should reach also the injecting semiconductor side. Therefore, when the thickness of the base layer 2 is too large, the above described operation of the circuit of the present invention will not occur.

Now, the principle of the switching operation at an ultra-high speed of the present invention shall be explained with reference to the arrangement in FIG. 1.

In FIG. 1, 9 is an output terminal for the output voltage at the emitter side by a switching operation. The other reference symbols mean the same as in the case of the pulse oscillation. Specifically, 6 can be considered to be a load resistance for taking out a negative resistance in the emitter circuit. This resistance 6 has also the same function as of the above described impedance for limiting currents. If the resistance 6 is selected to be of a proper value, that is to say, the value of the current limiting impedance is made smaller than in the case of the above-mentioned pulse-generation the current limiting effect may be reduced. The avalanche may reach steady state, when an injection voltage is applied to the terminals 5 and the electrons will be sufficiently injected from the emitter 1 into the semiconductors layers 2 and 3. In such case, an avalanche multiplication will occur, a large hole current will flow in a reverse direction, a part of it will flow out of the emitter and, therefore, as seen from the emitter 1, this circuit will have negative resistance characteristics of a current-control type.

This negative resistance can operate at very high frequencies and occurs at an electron injecting voltage, that is, at such low voltage of about 0.5 volt.

Therefore, the circuit according to the present invention utilizes a two-terminal negative-resistance as seen from between the terminals 8 and 9 and the potential of the terminal 9 performs a switching operation on the resistance 6.

The previously described high-speed pulse generating function performs a so-called astable or monostable operation. The here described ultra-high-speed switching function is to perform a bistable operation by choosing the smaller value of the resistance 6. In order that the emitter can feed the above described stable equilibrium current at the time of discharge, the value of the resistance 6 is selected to be of such small value that the circuit shown in FIG. 1 will shift to a bistable operation.

Unless the resistance 6 is attached, the variation of the switching operation will not occur. In this case, a resistance value of 10 to 100 ohms was proper for the structure of the embodiment. When this resistance was short-circuited, no switching operation was seen. When a higher resistance was connected, no switching operation occurred but the above-mentioned pulse-generating state was reached.

The limitation of the value of the resistance 6 depends on the design values and manufacturing dimensions of the semiconductors and can not be as simply determined. By experiments with a device having other design parameters, it has been confirmed that, when the resistance value is small, bistable switching operation will be realized, and when the resistance value is large, a monostable or astable pulse generating range will be reached.

The switching time in the bistable operation is determined by the avalanche ionization constant and saturation drift velocity and is about $10^{-12}$ second. However, under the influence of the lead inductance, it becomes as low as about $10^{-10}$ second. It is still higher than any of the known current-controlled switch devices. A high switching time of about 1 ns. or so was actually measured.

The voltage of the semiconductor layer 4 necessary for the above mentioned switching operation is the same as in the case of the pulse generation. It is less than 70 volts, in the above mentioned embodiment and is more than 40 volts the voltage at which an avalanche is likely to occur. In this voltage range, the base current flows in a direction reverse to that of the case of an ordinary transistor operation and shows the occurrence of an avalanche. In this voltage range, the switching operation occurred.

Figure 9:
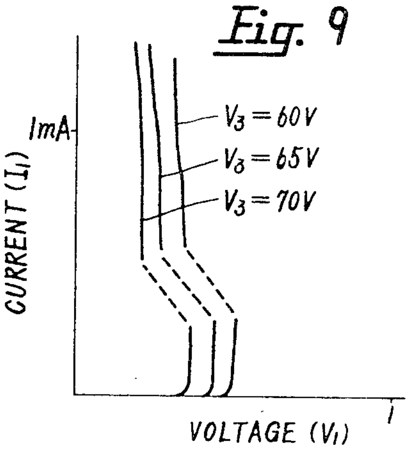
FIGURE 9 represents typical switching characteristics of the circuit shown in FIGURE 1.

An example of this switching characteristic is shown in FIG. 9. The two-terminal voltage-current characteristics of an emitter to base are shown. That is to say, it is shown that a current-controlled negative-resistance is induced at such low voltage as about 0.5 volt.

The switching speed with a trigger was measured and the delay of the negative resistance caused by such new effect was less than 0.5 ns.

When an operating bias was set just below a turnover point and a trigger of 0.05 volt was applied, a discharge was started and a variation of 0.2 volt was obtained as an output voltage. This is a proof of a switching operation capable of amplification.

The internal resistance ratio of the nondischarging and discharging state, that is, the on-off ratio was much larger than in a tunnel diode and was more than $10^4$. This shows an ideal switching characteristic as of a high-speed switch which is quite superior to any other circuit.

Providing an external series resistance in the base circuit has a positive feedback effect and therefore apparently increases the above-mentioned negative resistance. This is an effect due to a so-called avalanche-transistor. However, this deteriorates the high-speed characteristics and is therefore undesirable. On the other hand, the circuit in the present invention, has a feature of inherent high-speed characteristics.

Figure 10:
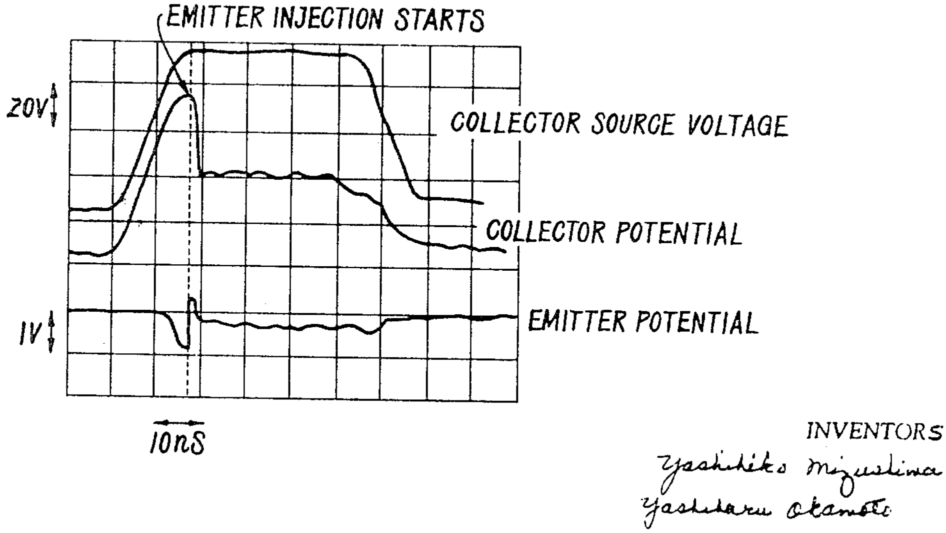
FIGURE 10 illustrates the switching potentials at the various electrodes of the circuit shown in FIGURE 1.

It shall be further added here that, needless to say, the circuit of the present invention shows a negative resistance simultaneously also on the collector side. Therefore, as an injection-induced negative resistance occurs in the emitter, the collector potential will shift at the same time to the discharging state and will be quickly reduced. This action can be also utilized for the switching operation. An example of this is shown in FIG. 10. As seen in the graph, at the same time as an injection occurs in the emitter, the collector will shift to a conducting state. Its delay was less than 0.5 ns. This shows that the device of the present invention has a property advanageous in practice and shows a feature as of a negative-resistance device which can be controlled with the third electrode potential.

As described in detail in the above, the present invention can be used in such various application in the pulse circuit technique as continuous high-speed pulse-generation exemplified in FIGS. 2 to 8, pulse shaping and amplification with triggers, logic circuits for operating pulses by gate-pulses, pulse-density modulators varying pulse separations with injected currents from emitters as exemplified in FIG. 6, coders for analog-digital conversions and pulse amplitude modulators varying pulse heights with collector voltages as exemplified in FIG. 7. Further, there has never been a switching circuit operating with a large switching ratio in a low voltage range with a high triggering efficiency, a circuit in which the electric power is amplified in such case and a circuit in which switching of a phase reversal to that of the emitter side is carried out on the collector side. They will have great effects on the ultra-high speed pulse technique which is hoped for future application.

What is claimed is:

1. A transistor circuit comprising a junction transistor, including an emitter electrode, a collector electrode and a base eelctrode, a current-limiting impedance in series with the emitter electrode of said transistor, means for supplying to said collector electrode a voltage higher than that which is sufficient to make a DC base current flow in the reverse direction to that in the lower collector voltage region and lower than either the avalanche voltage or the punch-through voltage of said transistor, said base electrode being substantially a common electrode of said transistor circuit, said avalanche voltage being defined as that avalanche voltage obtained with no injection from said emitter electrode, and means for supplying to said emitter electrode an emitter current sufficient to induce the avalanche-breakdown in said transistor.

2. A transistor circuit according to claim 1 wherein said junction transistor is a four layer structure including an intrinsic semiconductor layer between said base electrode and said collector electrode.

3. A transistor circuit according to claim 2 wherein the collector is of smaller area than the base area for concentrating the electric field produced in said intrinsic semiconductor layer.

4. A transistor circuit according to claim 3 wherein said means for supplying said collector voltage includes means for modulating the collector voltage with an input signal.

5. A transistor circuit according to claim 3 wherein said means for supplying the emitter current includes means for modulating the emitter current with an input signal.

References Cited

UNITED STATES PATENTS

| | | | |
|---|---|---|---|
| 3,075,092 | 1/1963 | Dill | 307—302 |
| 3,205,374 | 9/1965 | Cajal et al. | 307—302 |

OTHER REFERENCES

Electronic Engineering, "Avalanche Transistors," by Macario, pp. 262–68, May 1959.

Electronic Design, p. 8, by Cushman et al., August 1963.

JOHN W. HUCKERT, Primary Examiner

JERRY D. CRAIG, Assistant Examiner

U.S. Cl. X.R.

317—235